US009179558B1

(12) United States Patent
Limber et al.

(10) Patent No.: US 9,179,558 B1
(45) Date of Patent: Nov. 3, 2015

(54) CASE WITH PANEL FOR DISPLAY

(71) Applicant: Brite Case LLC, Tempe, AZ (US)

(72) Inventors: Jamie Limber, Tempe, AZ (US); Brian C. Woodbury, Gilbert, AZ (US)

(73) Assignee: Brite Case, LLC, Tempe, AZ (US)

( * ) Notice: Subject to any disclaimer, the term of this patent is extended or adjusted under 35 U.S.C. 154(b) by 198 days.

(21) Appl. No.: 14/048,313

(22) Filed: Oct. 8, 2013

Related U.S. Application Data

(63) Continuation-in-part of application No. 13/573,476, filed on Sep. 17, 2012, now abandoned.

(51) Int. Cl.
| | |
|---|---|
| *H04M 1/00* | (2006.01) |
| *H05K 5/00* | (2006.01) |
| *G06F 1/16* | (2006.01) |
| *G02F 1/1333* | (2006.01) |
| *G02F 1/167* | (2006.01) |

(52) U.S. Cl.
CPC ............ *H05K 5/0004* (2013.01); *G06F 1/1613* (2013.01); *G02F 1/133308* (2013.01); *G02F 1/167* (2013.01); *G06F 1/1626* (2013.01); *G06F 1/1633* (2013.01); *G06F 1/1656* (2013.01)

(58) Field of Classification Search
CPC ............... G06F 1/1626; G06F 1/1656; G06F 2200/1633; G06F 1/1633; G06F 1/26; G06F 2200/1634; H04B 1/3888; G01S 7/4813
USPC .......... 455/90.3, 566, 572, 573, 575.1, 575.8; 307/104; 361/679.01, 679.55, 679.56
See application file for complete search history.

(56) References Cited

U.S. PATENT DOCUMENTS

| | | | |
|---|---|---|---|
| 5,973,477 A | 10/1999 | Chang | |
| 6,006,118 A * | 12/1999 | Stephenson | ............... 455/575.1 |
| 6,035,221 A | 3/2000 | Snyder | |
| 6,502,951 B2 | 1/2003 | Marshall | |
| 6,542,757 B2 | 4/2003 | Bae | |
| 6,611,697 B1 | 8/2003 | Ewing | |
| 7,079,862 B2 | 7/2006 | Chien | |
| 7,086,748 B1 | 8/2006 | Elembaby | |
| 7,088,578 B1 * | 8/2006 | Gruby et al. | ............. 361/679.56 |
| 7,166,987 B2 | 1/2007 | Lee | |
| 7,400,917 B2 | 7/2008 | Wood | |
| 7,494,239 B2 | 2/2009 | Riccardi | |
| 7,600,139 B2 | 10/2009 | Ang | |
| 7,648,027 B2 | 1/2010 | Lin | |
| 7,728,281 B2 | 6/2010 | Chen | |
| 7,792,316 B2 | 9/2010 | Tan | |
| 7,852,184 B2 | 12/2010 | Yamazaki | |
| 7,854,319 B2 | 12/2010 | Yau | |
| 8,072,304 B2 | 12/2011 | Kato | |
| 8,509,861 B2 | 8/2013 | Eaton | |
| 2005/0255898 A1 | 11/2005 | Huang | |
| 2006/0003709 A1 | 1/2006 | Wood | |
| 2006/0022822 A1 | 2/2006 | Wong | |
| 2006/0274493 A1 * | 12/2006 | Richardson et al. | .......... 361/683 |

(Continued)

FOREIGN PATENT DOCUMENTS

| | | |
|---|---|---|
| WO | 2011150381 | 12/2011 |
| WO | 2013012354 | 1/2013 |

*Primary Examiner* — Olumide T Ajibade Akonai

(57) ABSTRACT

A panel for cooperating with a case and a mobile electronic device for displaying a presentation. The case encloses the panel and the mobile device while in a closed position. The panel may perform the function of receiving information from the mobile device and presenting the information on a display of the panel.

20 Claims, 12 Drawing Sheets

(56) References Cited

U.S. PATENT DOCUMENTS

| | | |
|---|---|---|
| 2008/0028650 A1 | 2/2008 | Ratcliffe |
| 2008/0132289 A1 | 6/2008 | Wood |
| 2008/0311964 A1 | 12/2008 | Shibuya |
| 2009/0312058 A9 | 12/2009 | Wood |
| 2010/0025286 A1 | 2/2010 | Mangaroo |
| 2010/0264054 A1* | 10/2010 | Beecroft et al. .............. 206/531 |
| 2011/0233078 A1 | 9/2011 | Monaco |
| 2011/0294470 A1 | 12/2011 | Pasquero |
| 2012/0147536 A1 | 6/2012 | Sa |
| 2012/0319500 A1 | 12/2012 | Beart |

* cited by examiner

CASE WITH PANEL FOR DISPLAY

FIELD OF THE INVENTION

Embodiments of the present invention relate to a panel (e.g., card, board, plate) that may be inserted (e.g., positioned, placed) into a case. The case at least partially encloses (e.g., surrounds, confines) a mobile device (e.g., mobile phone, tablet, e-reader, personal digital assistant). The panel cooperates with the case and with the mobile device to perform a function.

BACKGROUND OF THE INVENTION

Cases have been used to protect mobile devices from harm or to aesthetically decorate the mobile device. Some cases that include an auxiliary battery or permit attaching an accessory to the case have been disclosed. A mobile device user may benefit from a panel that may be inserted into a case for a mobile device. The panel may perform a function.

BRIEF DESCRIPTION OF THE DRAWING

Embodiments of the present invention will now be further described with reference to the drawing, wherein like designations denote like elements, and.

DETAILED DESCRIPTION OF THE PREFERRED EMBODIMENTS

Figure 1:
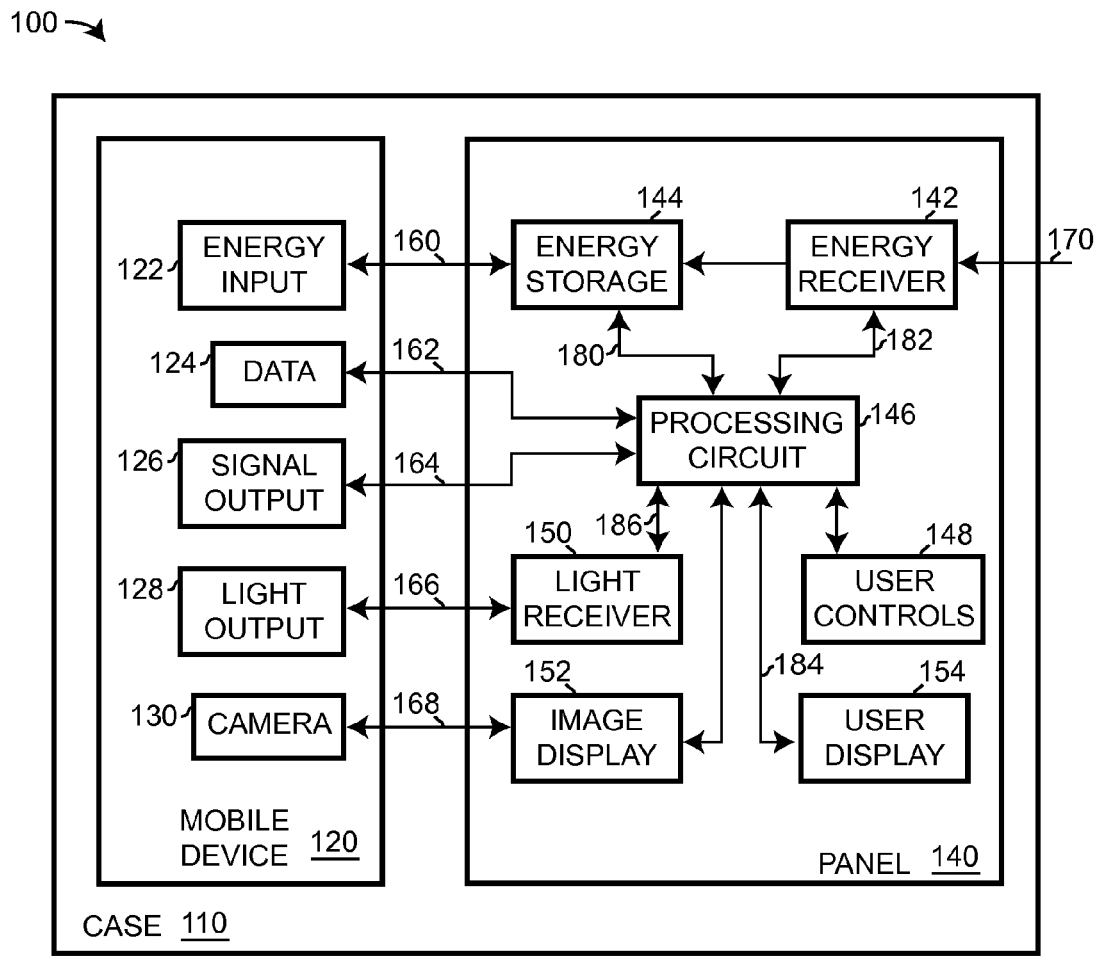
FIG. 1 is a functional block diagram of a system according to various aspects of the present invention.

A case may at least partially enclose a mobile device. A mobile device may include a cell phone, a tablet, a personal digital assistant, an e-reader, and an electronic device. A case may protect a mobile device. A case may decorate (e.g., embellish) a mobile device. A case may enclose (e.g., hold, support), at least partially, a panel. A panel may perform a function. A panel may cooperate with the mobile device, while enclosed in the case, to perform the function. A case may be disassembled, in whole or in part, to replace the panel with another panel having a different function.

A function performed by a panel may include receiving energy, storing energy, providing energy to the mobile device, receiving information (e.g., data, signal) from a user, receiving information from the mobile device, providing information to a mobile device, and providing information to a user.

A mobile device may receive energy from a panel to perform the functions of the mobile device. Receiving information from a mobile device may include receiving information via a source of light controlled by the mobile device and/or receiving electrical signals from the mobile device via an interface. An electrical signal provided by a mobile device may include an audio (e.g., analog) signal and/or a data (e.g., digital) signal provide via a bus. Providing information to a mobile device may include providing an image (e.g., graphical) for capture by a camera of the mobile device and/or providing electrical signals (e.g., analog, digital) to the mobile device via an interface. Receiving information from a user may include receiving information via controls (e.g., switches, dials, buttons, touch screen) that are manually manipulated by the user. Providing information to a user may include presenting information on a display. The functions of the controls and the display may be combined in a touch screen display.

A panel may include circuitry and/or components to perform a single function or two or more functions. A panel that performs a function may be removed from the case and replaced by a different panel that performs a different function. A panel that performs a function may be removed from the case and not replaced. A panel may perform a function in cooperation with a particular type (e.g., model, brand, version) of a mobile device, with many types of mobile devices, or all types of mobile devices. Removing a panel from the case requires disassembling the case and separating portions of the case from each other to gain access to the panel.

A case may position (e.g., hold, place, situate) a panel to cooperate with a mobile device to perform a function. A case may position a coupler to enable information transfer between a panel and a mobile device. A case may position a transmitter and/or a receiver to enable information transfer between a panel and a mobile device. A case may position a mobile device relative to a panel to enable information transfer. A panel may include the transmitter and the mobile device the receiver or vice versa. A transmitter may include a source of light. A receiver may include a photodetector (e.g., light detector). A transmitter may include a display that presents an image. A receiver may include a camera that detects the presentation of the image.

Figure 2:
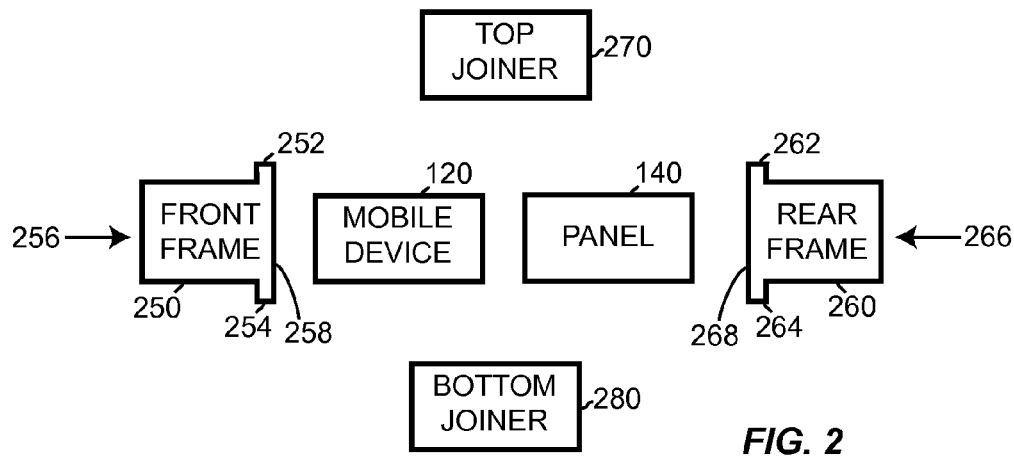
FIG. 2 is a functional diagram of some mechanical aspects of the system according to various aspects of the present invention.
Figure 3:
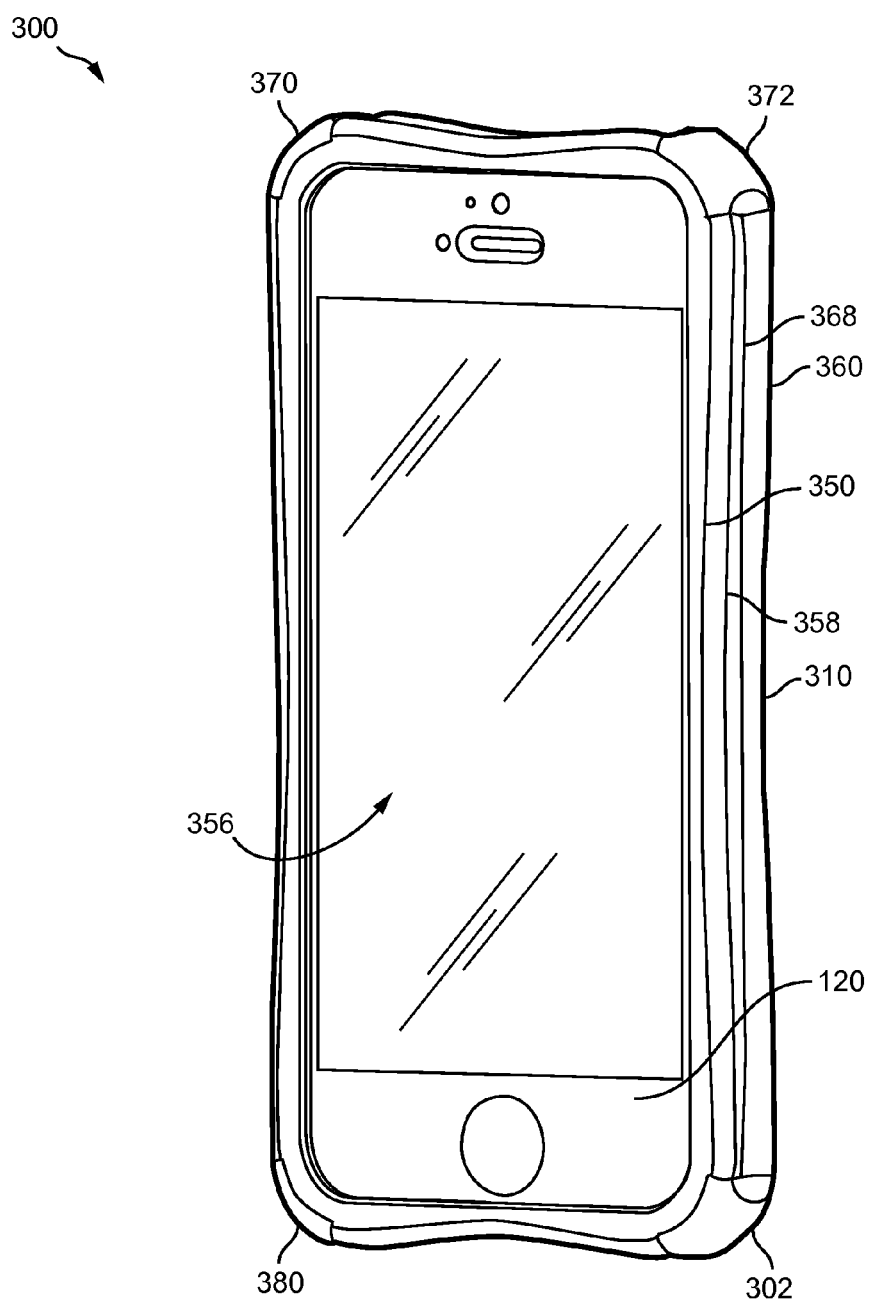
FIG. 3 is a plan view of a front perspective of an implementation of the system of FIGS. 1 and 2.
Figure 4:
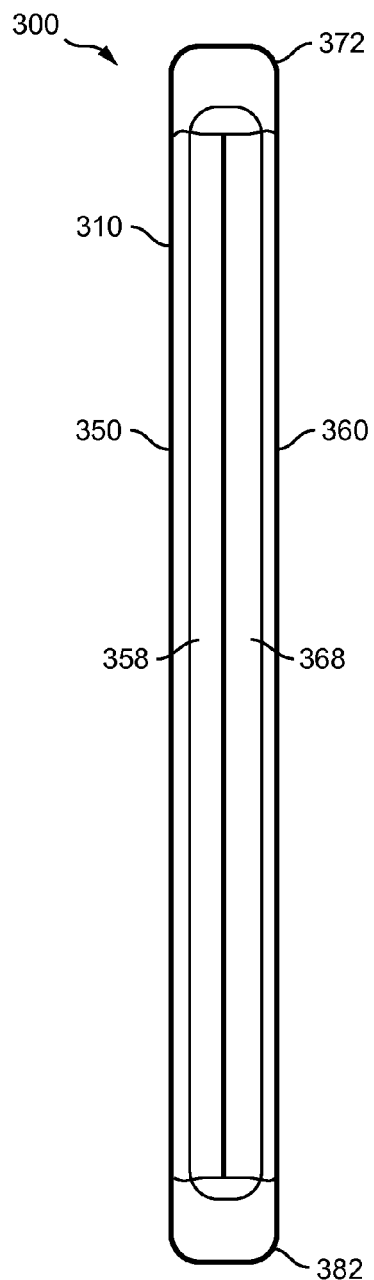
FIG. 4 is a plan view of the right side of the implementation of FIG. 3.
Figure 5:
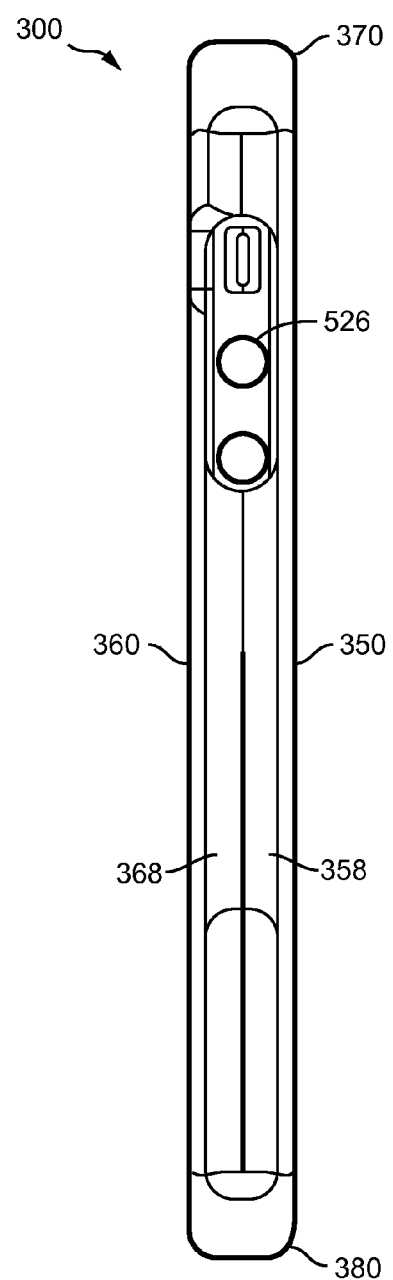
FIG. 5 is a plan view of the left side of the implementation of FIG. 3.
Figure 6:
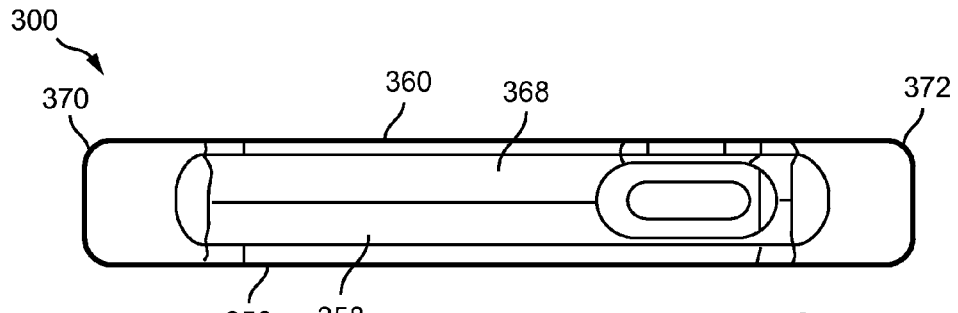
FIG. 6 is a plan view of the top of the implementation of FIG. 3.
Figure 7:
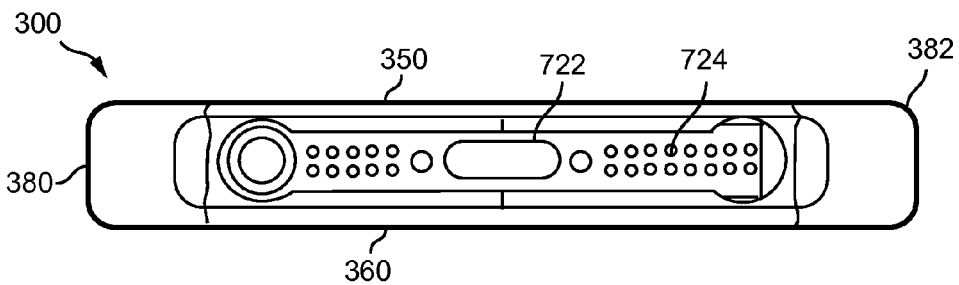
FIG. 7 is a plan view of the bottom of the implementation of FIG. 3.

System 100 of FIGS. 1-2 includes case 110, mobile device 120, and panel 140. Case 110 may include front frame 250, rear frame 260, top joiner 270, and bottom joiner 280. Mobile device 120 may include any electronic device suitable for use with case 110 and panel 140 and in particular those electronic devices discussed above.

Mobile device 120 may include energy input 122, data 124, signal output 126, light output 128, and camera 130.

Energy input 122 may receive energy (e.g., power, charge) via connector 160. Energy input 122 may provide energy to mobile device 120 (e.g., battery) for performing the functions of mobile device 120. Connector 160 may include a connector socket (e.g., micro USB, lightening connector, interface) used by a recharger provided by the manufacture to recharge the battery of the mobile device.

Data 124 provides and/or receives information (e.g., data) via connector 162. Connector 162 may be the same socket accessed by a cable provided by the manufacturer to send data to and receive data from mobile device 120.

Signal output 126 provides a signal (e.g., analog, digital) via connector 164. Connector 164 may include the socket that receives a headphone jack. The signal provided by signal output 126 may include audio information and/or any other type of information that may be provided by signal output 126 via connector 164. Signal output 126 may be controlled by an application that encodes information of any type for provision via a signal on connector 164.

Light output (e.g., light source) 128 provides light via connector 166. Connector 166 includes any medium such as air, light pipe, and/or fiber (e.g., fiber optical cable). Light output 128 may include a light emitting device (e.g., flash, LED) used to provide light for camera 130. The light provided by light output 128 may be interrupted (e.g., stop, start, modulated) or encoded in any conventional manner to permit light output 128 to provide information via the light of connector 166. The light provided by light output 128 may be interrupted and/or encoded by any conventional application provided with mobile device 120 or by an application and/or software provided for and executable on mobile device 120.

In one implementation, the light provided by light output 128 may be encoded to provide information to panel 140 via connector 166 (e.g., air) and light receiver (e.g., light detector) 150. The information may include notices, alerts, emails, and texts received by mobile device 120 and/or information presented by mobile device 120 on its display (not shown in FIG. 1).

Camera 130 receives light via connector 168. For conventional cameras found on many mobile devices, connector 168 includes air. Camera 130 may take a picture of an image. The image may be analyzed and/or processed by a processing circuit of mobile device 120. Using an appropriate application, an image captured by camera 130 may be analyzed to determine whether it includes information. Information may be encoded (e.g., barcode, Aztec code, data matrix code, color barcode, maxicode, QR code) in an image captured by camera 130. Mobile device 130 may execute an application for extracting the information encoded in the image. Panel 140 may provide an image to transfer information from panel 140 to mobile device 120.

Panel 140 may include energy receiver 142, energy storage 144, light receiver 150, image display 152, user controls 148, user display 154, and processing circuit 146.

Processing circuit 146 may include any conventional circuit. Functions performed by processing circuit 146 may include converting data, analyzing signals, monitoring signals and/or operations, detecting changes, processing information, providing information, recording information, storing information, retrieving information from storage, comparing, capturing, and/or any other conventional function performed by conventional circuits.

Processing circuit 146 may include conventional microprocessors, signal processors, programmable logic, and/or discrete passive and active components. Processing circuit 146 may include printed circuit boards, connectors, cables, busses, and/or other conventional electronic and electrical devices.

Processing circuit 146 may include one or more microprocessors that executed a stored program. Processing circuit 146 may receive information regarding the function and/or state of panel 140 or the components of panel 140 (e.g., 142-154) and use such information to affect (e.g., alter) the execution of the executable program. The executable program may be stored in memory that is part of processing circuit 146. An executable program may be received from mobile device 130 via data 124 and connector 162 and/or via light output 128 connector 166.

Energy receiver 142 receives energy via connector 170. Connector 170 may include an electromagnetic field (e.g., wireless connection) and/or one or more conductors (e.g., wires, wired connection). Energy receiver 142 receives energy from a source (e.g., wall outlet, wireless charger). Energy receiver 142 may condition (e.g., alter, convert, adjust, level shift, transform) the energy as received or as provided to energy storage 144. Processing circuit 146 may monitor and/or control the operation of energy receiver 142.

Energy storage 144 receives energy from energy receiver 142. Energy storage 144 may store energy. Energy storage 144 provides energy. Energy storage 144 may condition the energy upon receipt or upon provision. Energy storage 144 may store energy in any conventional manner. Energy storage 144 may include storing energy in a rechargeable battery. Energy storage 144 may provide energy to energy input 122 via connector 160. Connector 160 may include any conventional connector for providing energy to a mobile device. Connector 160 may include an electromagnetic field for wireless transfer of energy and/or one or more conductors (e.g., wires). Processing circuit 146 may monitor and/or control the storage of energy by energy storage 144 and/or the provision of energy from energy storage 144. Processing circuit 146 may control energy receiver 142 and energy storage 144 so that energy storage 144 is not over charged with energy or damaged by the charging process.

Energy storage 144 may provide energy for the operation of the electronic and/or electrical devices and components of panel 140. For example, energy storage 144 may provide the power for operating components 142-154 of panel 140. Energy receiver 142 may further provide energy for the operation of the components of panel 140 or work in cooperation with energy storage 144 to provide the power needed for panel 140 to perform its functions.

Light receiver 150 detects light provided via connector 166. As discussed above, connector 166 may include a gap of air between light output 128 and light receiver 150. Light receiver 150 includes any conventional light detector (e.g., photosensor, photodetector, CCD, photodiodes). Light receiver 150 may detect light in the range (e.g., visible, infrared) provided by conventional mobile devices. Light receiver 150 may convert pulses of light into electrical (e.g., analog, digital) information. Light receiver 150 may demodulate and/or decode any conventional modulation or encoding that may be used to modulate and/or encode information onto light. The demodulating and/or decoding function of light receiver 150 may be performed all or in part by processing circuit 146. Light receiver 150 may provide information sent via light to processing circuit 146 as an electrical signal. Processing circuit 146 may perform an operations on the information or take an action responsive to the information.

Image display 152 presents an image. The image may include any graphical content and/or information in any language or encoding. Image display 152 may include any conventional display technology (e.g., LCD, LED, plasma, seven-segment) for presenting an image. Image display 152 presents the image for capture by camera 130 of mobile device 120 via connector 168. Connector 168 may include optical fiber, a lens, light pipe, and/or a gap of air. A lens may adjust the image provided by image display 152 in any manner so that camera 130 may capture the image. A lens may compensate for the distance between camera 130 and image display 152 for the focal length of camera 130. An image may be encoded to include information. Any conventional encoding may be used. The image presented by image display 152 may vary occasionally or change at a frame rate (e.g., motion picture). Processing circuit 146 may provide the information to create the presentation of the image on image display 152. An application of mobile device 120 may receive the image provided by image display 152 via camera 130, decode the image to extract the information, and operate on or responsive to the information.

User controls 148 receives information from a user of system 100. User controls 148 may include any conventional device that translates manual movements of a user into electrical information for processing circuit 146. User controls 148 may include buttons, switches, levers, knobs, and/or any conventional device for detecting manual operation by a human operator. User controls 148 may receive information from a user and provide the information as electrical signals to processing circuit 146. Processing circuit 146 may receive the information, act on the information, and/or take an action responsive to the information.

User display 154 may present images for viewing by a user. User display 154 may include any conventional technology for presenting images. The images may be in black and white or color. User display 154 may have any resolution needed to present information (e.g., content) to a user. Processing circuit 146 may monitor and/or control user display 154. Processing circuit 146 may provide the information that is presented on user display 154. Processing circuit may receive information via any connector (e.g., 162-166, 170) and/or user controls 148 for presenting on user display 154. User display 154 may further include devices for providing haptic and/or audible information to a user.

All or part of the functions of user controls 148 may be performed by user display 154 when user display 154 is implemented as a touch screen display. Processing circuit 146 may receive information from both user controls and/or a touch screen implementation of user display 154.

As discussed above, panel 140 may include circuitry and/or components to perform a single function or more than one function. Implementations of panel 140 that perform a single function are provided below in Table 1 along with the circuits (e.g., 142-154) that may be needed to implement the function.

TABLE 1

Functions of a Single Function Panel

| Function | Likely Panel Circuits | Notes |
|---|---|---|
| Power | Energy receiver 142; Energy storage 144; and Processing circuit 146. | Energy stored for use by panel 140 and mobile device 120. |
| Data Backup | Processing circuit 146; and Light receiver. | Data received by panel 140 via light receiver 140 or from connector 162, stored by processing circuit 146 in memory. Data may be transferred back to mobile device via connector 162 or by image display 152 via camera 130. Data may be transfer to a user or another electronic device via user display 154. |
| User Display | Processing circuit 146; Light receiver 150; and User display 154. | Data received by panel 140 via light receiver 140 or from connector 162 and presented on user display 154. May also receive information via user controls 148 for display on user display 154. |
| Audio Display | Processing circuit 146; Signal output 126; and User display 154. | Processing circuit 146 may receive audio data from signal output 126 via connector 164 and provide a presentation on user display 154 related to the audio data (e.g., song name, light operation to music beat). |

TABLE 1-continued

Case 110 includes front frame 250, rear frame 260, top joiner (e.g., clip, button, bumper) 270, and bottom joiner 280. Front frame 250 and rear frame 260 mechanically cooperate with joiner 270, joiner 280, mobile device 120, and panel 140 to form system 100.

Front frame 250 at least partially encloses (e.g., encircles, surrounds) mobile device 120. Rear frame 260 at least partially encloses panel 140 and possibly a portion of mobile device depending on the thicknesses of panel 140 and mobile device 120. Front frame 250 is positioned proximate to rear frame 260 so that all or part of front lip 258 touches (e.g., contacts) rear lip 268. Touching may include an overlap and/or interlocking (e.g., nesting, interference) of at least a portion of front lip 258 with at least a portion of rear lip 268.

Front frame 250 and rear frame 268 are held in a proximate (e.g., touching, case 110 closed) relationship by top joiner 270 and bottom joiner 280. Front frame includes top protrusion (e.g. tab) 252 and bottom protrusion 254 while rear frame includes top protrusion 262 and bottom protrusion 264. A protrusion may be along all or a portion of the top and/or bottom of front frame 250 or rear frame 260. Top protrusion 252 may include a plurality of protrusions that correspond (e.g., match) to a plurality of protrusions 262. Bottom protrusion 254 may include a plurality of protrusions that correspond to a plurality of protrusions 264.

While front frame 250 and rear frame 260 are in a proximate position (e.g., relationship), top joiner 270 couples to (e.g., establishes an interference with) top protrusions 252 and 262 and bottom joiner 280 couples to bottom protrusions 254 and 264. Joiners 270 and 280 maintain (e.g., keep) front frame 250 and rear frame 260 in a proximate relationship, and thereby retain case 110 in a closed position. Top joiner 270 may include a plurality of joiners that correspond (e.g., match) in number a plurality of pairs of corresponding top protrusions 252 and top protrusions 262. Bottom joiner 280 may include a plurality of joiners that correspond in number a plurality of pairs of corresponding bottom protrusions 254 and bottom protrusions 264.

While case 110 is in the closed position, front frame 250 and rear frame 260 cooperate to position mobile device 120 proximate to panel 140. In an implementation, nothing is positioned between mobile device 120 and panel 140 so that mobile device 120 and panel are adjacent and possibly touching to each other. In another implementation, a protective sheet is placed between mobile device 120 and panel 140 to mechanically and electrostatically protect and separate mobile device 120 and/or panel 140.

While case 110 is in the closed position, front frame 250 and rear frame 260 may further cooperate to position portions of mobile device 120 relative to portions of panel 140, for example so that energy input 122 may be proximate to the output of energy storage 144, light output 128 is across from (e.g., directly proximate to) light receiver 150, and camera 130 is across from image display 152. A gap of air may exist between light receiver 150 and light output 128 or image display 152 and camera 130. While case 110 is closed, mobile device 120 and panel 140 are maintain is the position relative to each other.

While case 110 is in the closed position, case 110 may protect mobile device 120 and panel 140 from damage caused by dropping, falling, and/or impact. Front frame 250 and rear frame 260 may be formed of a semi-rigid material (e.g., plastic) that absorbs or deflects a force of impact away from mobile device 120 and/or panel 140. Top joiner 270 and bottom joiner 280 may further be formed of a material (e.g., rubber) that absorbs a force of impact rather than transfer the force to mobile device 120 and/or panel 140.

At least a portion of front frame 250 and rear frame 260 must be moved from the proximate position to a distal (e.g., non-touching) position to permit mobile device 120 and/or panel 140 to be removed from and/or inserted into case 110. Top joiner 270 and/or bottom joiner 280 may be removed to permit the separation of front frame 250 from rear frame 260. Removing top joiner and/or bottom joiner and separating front frame 250 from rear frame 260 partially or fully (e.g., completely) puts case 110 in an open position (e.g., condition, state). Opening case 110 allows mobile device 120 and/or panel 140 to be removed from system 100. Mobile device 120 and/or panel 140 cannot be removed from case 110 without removing top joiner 270 and/or bottom joiner 280 and separating at least a portion of front frame 250 and back frame 260.

Separating front frame 250 from back frame 260 may include removing top joiner 270 while leaving bottom joiner 280 coupled to front frame 250 and back frame 260. While using this method for opening case 110, bottom joiner 280 functions as a hinge to permit the separation of front frame 250 from rear frame 260 along all portions of lip 258 and lip 268 except for a small portion proximate to bottom joiner 280.

Front frame 250 may include aperture 256 to allow user access to operate mobile device 120 while case 110 is in the closed position. Rear frame 260 may include aperture 266 to allow user access to panel 140 to operate user controls 148 and/or view user display 154.

System 300 of FIGS. 3-13 is an implementation of system 100. System 300 includes case 310, mobile device 120, and panel 840. Case 310 includes front frame 350, rear frame 360, and bumpers 370-372 and 380-382. Front frame 350 includes lip 358, aperture 356, and protrusions 910-912 and 920-922. Rear frame includes lip 368, aperture 866, and protrusions 950-952 and 960-962.

Front frame 350 and rear frame 360 may respectively perform the functions and/or include the structures of front frame 250 and rear frame 260 discussed above. Case 310 may perform the functions and/or include the structures of case 110 discussed above. Bumpers 370-372 and 380-382 may perform the functions and/or include the structures of top joiner 270 and/or bottom joiner 280 discussed above. Protrusions 910-912 and 920-922 may perform the functions and/or include the structures of protrusions 252-254 and 262-264 discussed above. Panel 840 may perform the functions of panel 140 discussed above. Case 310 may cooperate with mobile device 120 and panel 840 as discussed above with respect to case 110, mobile device 120, and panel 140.

In an assembled position (e.g., case closed), lip 358 at least partially wraps around and/or encloses mobile device 120 and lip 368 at least partially wraps around and/or encloses panel 840 and possibly a portion of mobile device 120, depending on the thickness of panel 840 and mobile device 120. Lips 358 and 368 are positioned proximate to each other and may contact each other in one or more locations in the assembled position. While in the assembled positioned, protrusions 910, 912, 920, and 922 are proximate to and/or touch (e.g., contact) protrusions 950, 952, 960, and 962 respectively. Bumpers 370, 372, 380, and 382 contact and hold (e.g., secure) protrusions 910 and 950, 912 and 952, 920 and 960, and 922 and 962 together respectively thereby holding front frame 350 and rear frame 360 together. Because lips 358 and 368 enclose mobile device 120 and panel 840, securing front frame 350 to rear frame 360, as discussed above, secures mobile device 120 and panel 840 in case 310.

Front frame 350 may further include one or more tabs 930 that, in the assembled position, mate with (e.g., nest with, insert into) recesses 932 of rear frame 360. The cooperation of tabs 930 with recesses 932 further secures front frame 350 to rear frame 360. Tabs 930 may be an extension of lip 358. Recesses 932 may be formed (e.g., positioned) in lip 368. Rear frame 360 may include one or more tabs 940 that mate with corresponding recesses 942 in front frame 350. One or more tabs may be inserted into and/or removed from their corresponding recesses with little or no force. One or more tabs may interfere with (e.g., touch) the sides of their respective recesses, to some extent, to create a friction (e.g., interference) fit; however, the tabs may be removed from the recesses to separate front frame 350 from rear frame 360 to dissemble (e.g., open) case 310. Tabs 930 and 940 may be removed from recesses 932 and 942 without damaging case 310, mobile device 120, and/or panel 840. All or some of tabs 930 and 940 may be removed from recesses 932 and 942 respectively to open case 310.

Bumpers 370-372 and 380-382 may include any conventional structure (e.g., hook, latch, interference, friction, elastic force, deforming feature) for cooperating with protrusions 910-912, 920-922, 950-952, and 960-962 to hold front frame 350 and rear frame 360 together. Structures for bumpers 370-372 and 380-382 and protrusions 910-912, 920-922, 950-952, and 960-962 may include the structures disclosed in U.S. application Ser. No. 13/573,476 entitled "Case for Wireless Devices" with first named inventor Jamie Limber that was filed on Sep. 17, 2012, which is incorporated herewith in its entirety for any purpose.

Bumpers 370-372 and 380-382 removeable couple to protrusions 910-912, 920-922, 950-952, and 960-962. Bumpers 370-372 and 380-382 couple to protrusions 910-912, 920-922, 950-952, and 960-962 to close case 310 and to retain mobile device 120 and panel 840 inside case 310. All or a portion of bumpers 370-372 and 380-382 decouple from all or a portion of protrusions 910-912, 920-922, 950-952, and 960-962 to open case 310 so that mobile device 120 and/or panel 840 may be removed from and/or inserted into case 310. Decoupling bumpers 370-372 and 380-382 from protrusions 910-912, 920-922, 950-952, and 960-962 permits front frame 350 to be separated from rear frame 360 partially or completely.

All bumpers 370-372 and 380-382 may be removed so that front frame 350 and/or rear frame 360 may be completely separated so that lip 358 is not proximate to (e.g., contacting) lip 368. Complete separation of front frame 350 and rear frame 360 allows mobile device 120 and panel 840 to be easily moved past lips 358 and 368 for removal from or insertion into case 310. Complete separation of front frame 350 from rear frame 360 permits mobile device to be removed from front frame 350 independent of removal of panel 840 from rear frame 860. Frames may be separated a minimum distance 1220 to permit mobile device 120 and/or panel 840 to be moved clear of lip 358 and/or lip 368 and out of case 310 for example in direction 1210.

Removal of a bumper of bumper 370-372 and 380-382 from case 310 may include complete separation of bumper 370-372 and 380-382 from protrusions 910-912, 920-922, 950-952, and 960-962 so that the bumper does not contact any portion of case 310. Removal of a bumper of bumper 370-372 and 380-382 from case 310 may include decoupling the bumper from protrusions 910-912, 920-922, 950-952, and 960-962 and/or case 310 without completely separating the bumper from case 310. For example, bumpers 370-372 and 380-382 may remain coupled to protrusions 950-952 and 960 to 962 but be decoupled from protrusions 910-912 and 920-922.

At least two bumpers of bumpers 370-372 and 380-382 may be removed so that a portion (e.g., top, side, bottom) of front frame 350 may be separated from a portion of rear frame 360. Removing two bumpers permits front frame 350 to be moved in direction 1320 away from rear bumper 360 and rear bumper moved in direction 1310 away from front bumper 350. Two bumpers of bumpers 370-372 and 380-382 may remain coupled to protrusions 910-912, 920-922, 950-952, and 960-962 and still permit a part of front frame 350 to move in direction 1320 and a part of rear frame 360 to move in direction 1310. Once front frame 350 is sufficiently separated from rear frame 360 so that mobile device 120 and/or panel 840 may clear lip 358 and/or 368, mobile device 120 and/or panel 840 may be inserted into and/or removed from case 310 long path 1210.

As discussed above, bumpers 380 and 382 may function as a hinge (e.g., pivot point) for pivoting front frame 350 away from rear frame 360 to open case 310. Opening case 310 in this manner separates lip 358 from lip 368 along most of front frame 350 and rear frame 360. Portions of lip 358 may stay in contact with lip 368 between bumpers 380 and 382, but separate completely on all other portions of front frame 350 and rear frame 360. This near complete separation of front frame 350 from rear frame 360 permits mobile device 120 and/or panel 840 to be inserted into and/or removed from case 310.

Removing only one bumper of bumper 370-372 and 380-382 will not permit front frame 350 to be separated from rear frame 360 because front frame 350 and rear frame 360 are held in the closed (e.g., proximate, touching, interlocked) position by the remaining bumpers. Removing two bumpers of bumper 370-372 and 380-382 that are positioned diagonally from each other (e.g., 370 and 382, 952 and 380) does not permit front frame 350 to be separated sufficiently from rear frame 360 to permit removal of mobile phone 120 or panel 840.

Front frame 350 must be move away from rear frame 360 at least distance 1220 (e.g., thickness of mobile device, thickness of panel, height of lip) to allow mobile device 120 and/or panel 840 to be removed from and/or inserted into case 310.

Although system 300 discusses using only four bumpers 370-372 and 380-382, more bumpers may be used to hold front frame 350 in a closed position with respect to rear frame 360. Using more bumpers than four may require the removal of additional bumpers to allow the removal of mobile device 120 and/or panel 840. Preferably, all bumpers are removed or all bumpers except those that function as a hinge to open case 310.

Bumpers 370-372 and 380-382 are discussed as coupling to case 310 only at the corners of case 310. A bumper may couple to front frame 350 and rear frame 360 at any location along the frames to couple frame 350 and rear frame 360 together. Regardless of the relative position of the bumpers to each other, adjacent bumpers will likely need to be removed to permit removal and/or insertion of mobile device 120 and/or panel 840.

Figure 14:
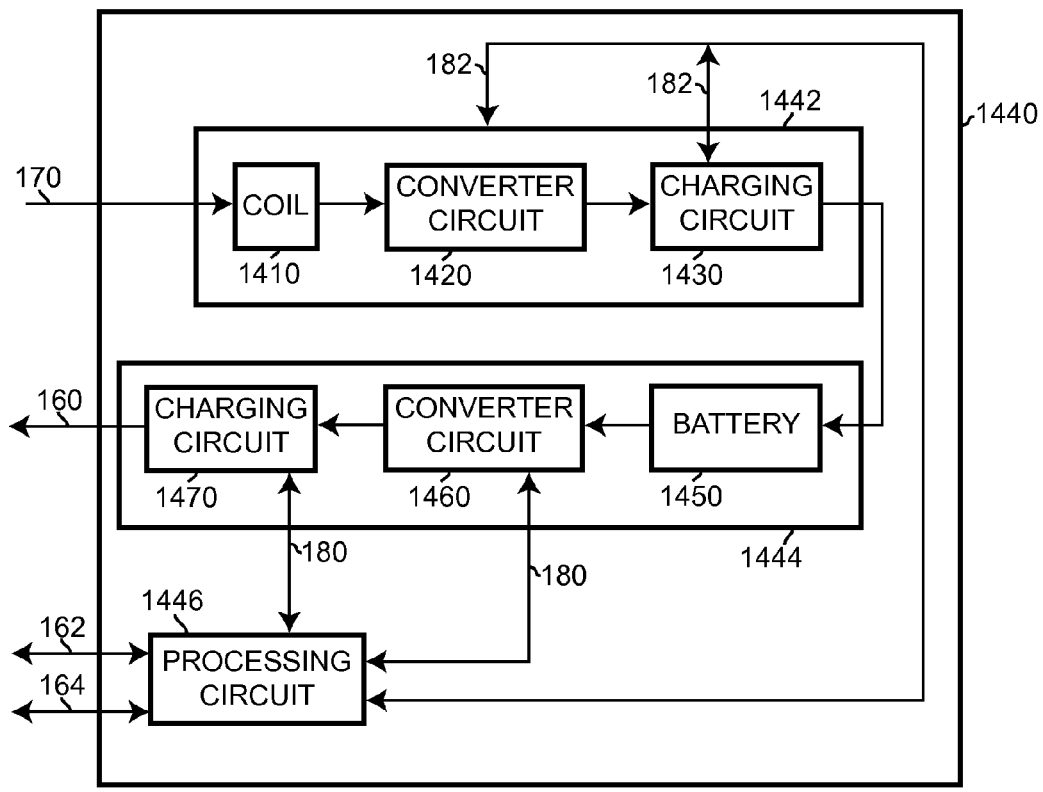
FIG. 14 is a functional block diagram of a panel with an implementation of a function of FIG. 1 according to various aspects of the present invention.
Figure 8:
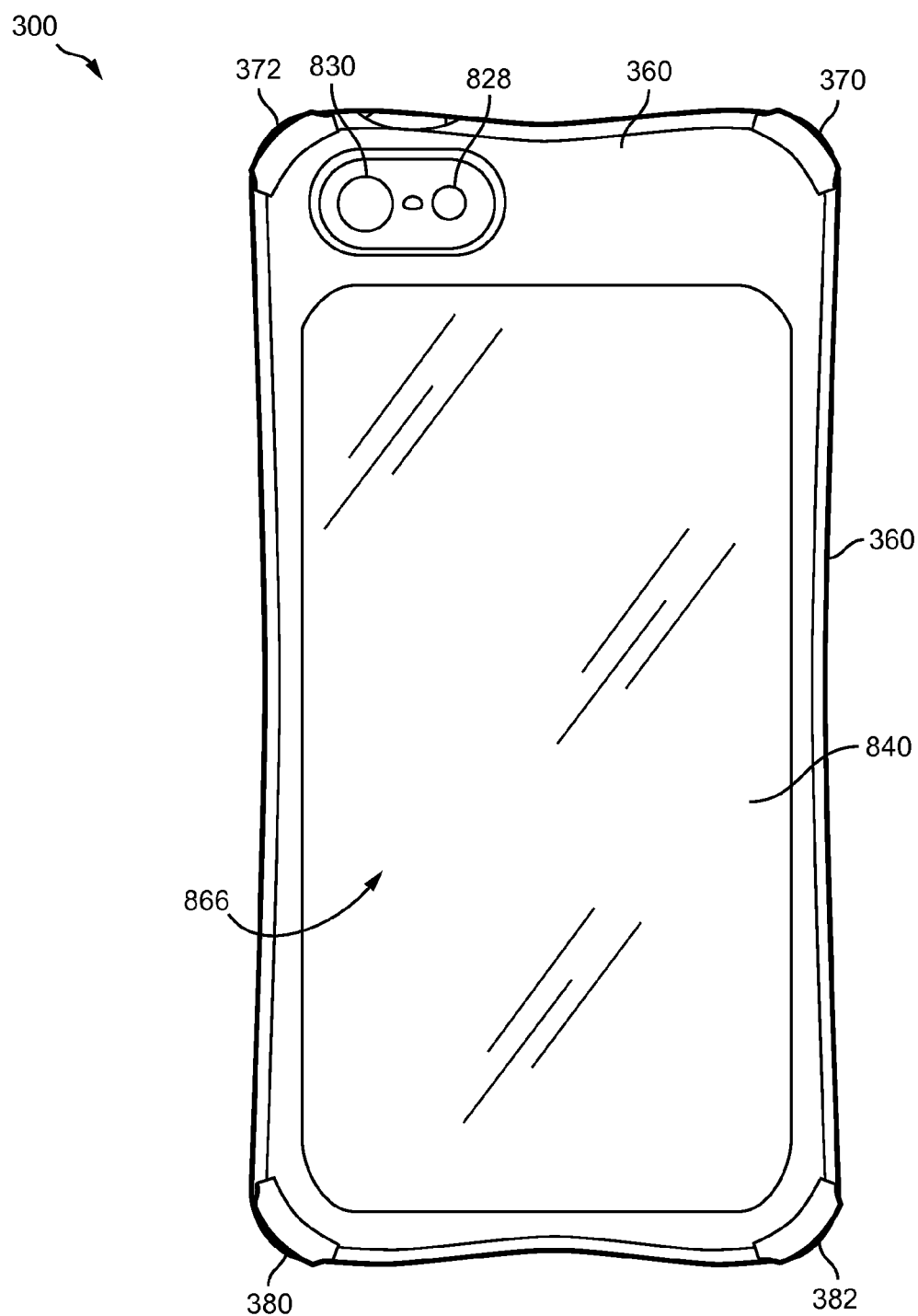
FIG. 8 is a plan view of the rear of the implementation of FIG. 3.
Figure 9:
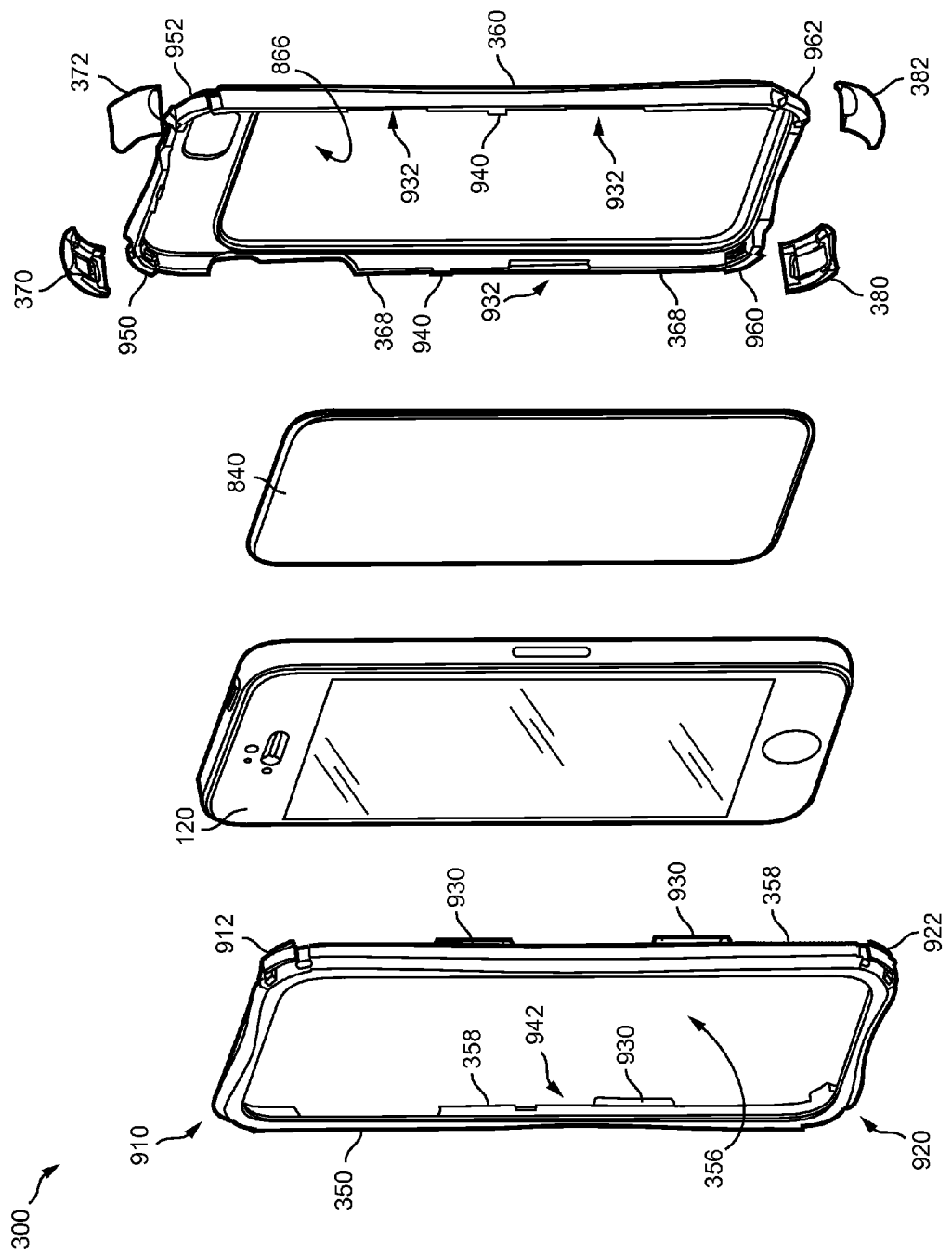
FIG. 9 is a plan view of the implementation of FIG. 3 expanded.
Figure 10:
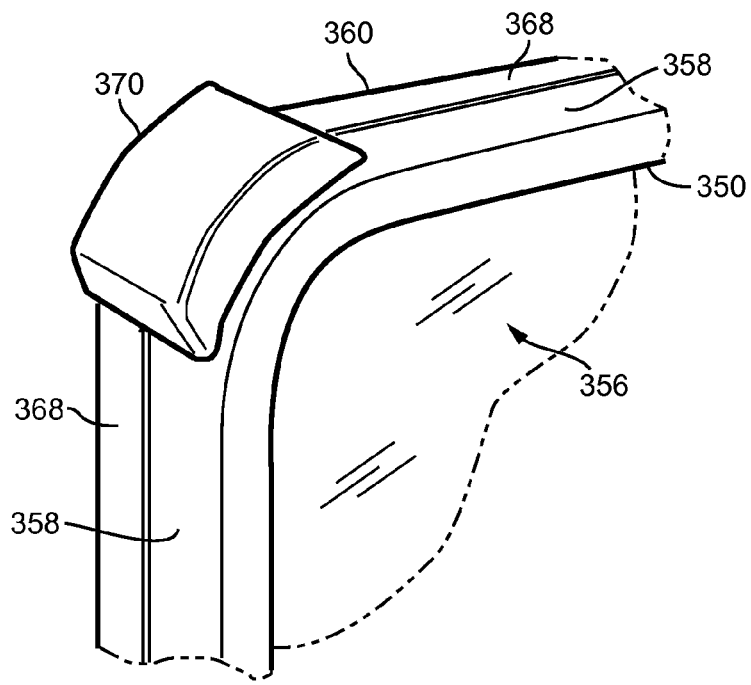
FIG. 10 is a close-up plan view of the top left portion of the implementation of FIG. 3 with a bumper coupled to the front and back frame.
Figure 11:
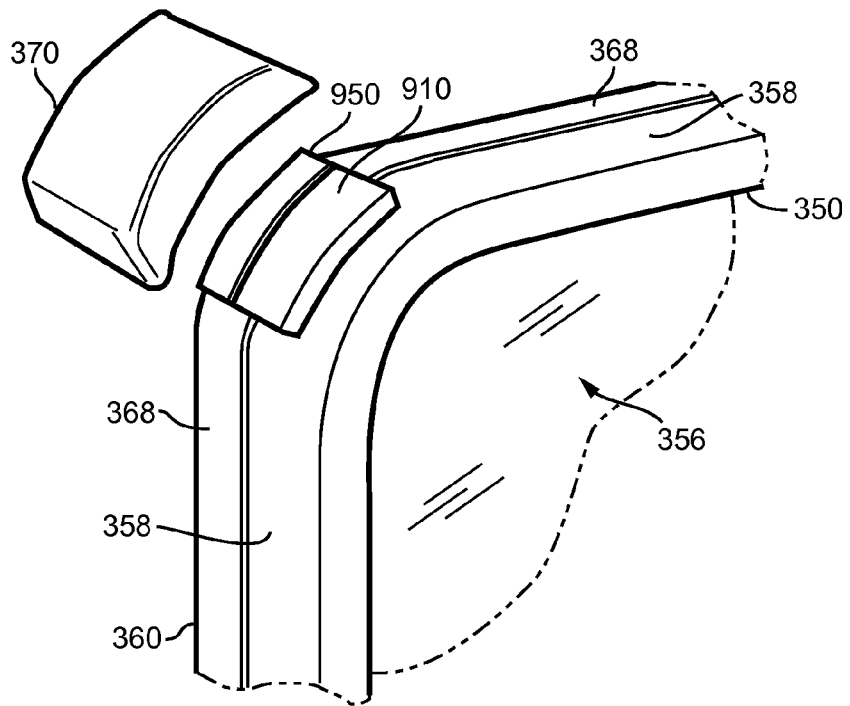
FIG. 11 is a close-up plan view of the top left portion of the implementation of FIG. 3 with the bumper decoupled from the front and back frame.
Figure 12:
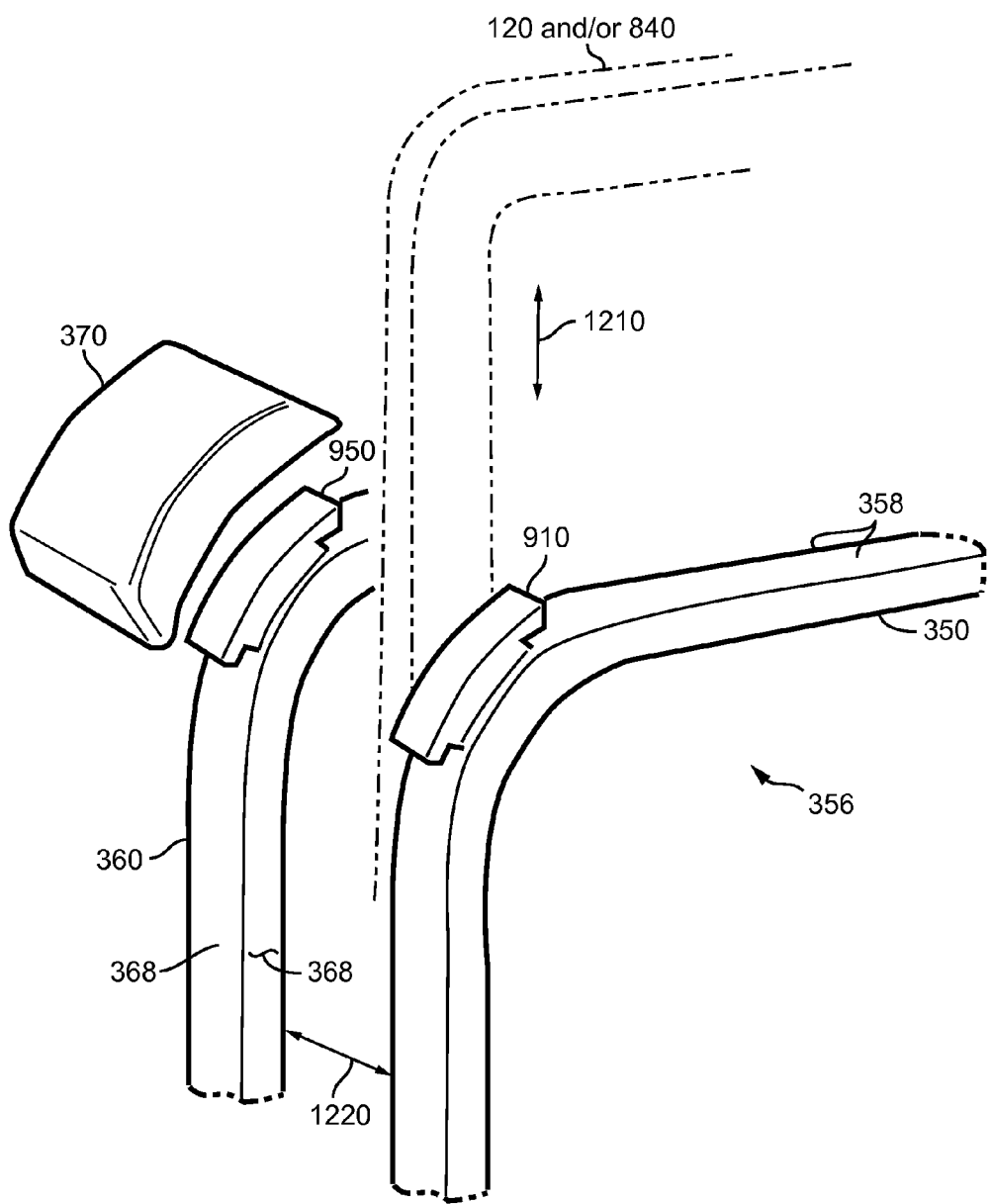
FIG. 12 is a close-up plan view of the top left portion of the implementation of FIG. 3 with the bumper decoupled and the front and back frames separated to remove the mobile device and/or the panel.
Figure 13:
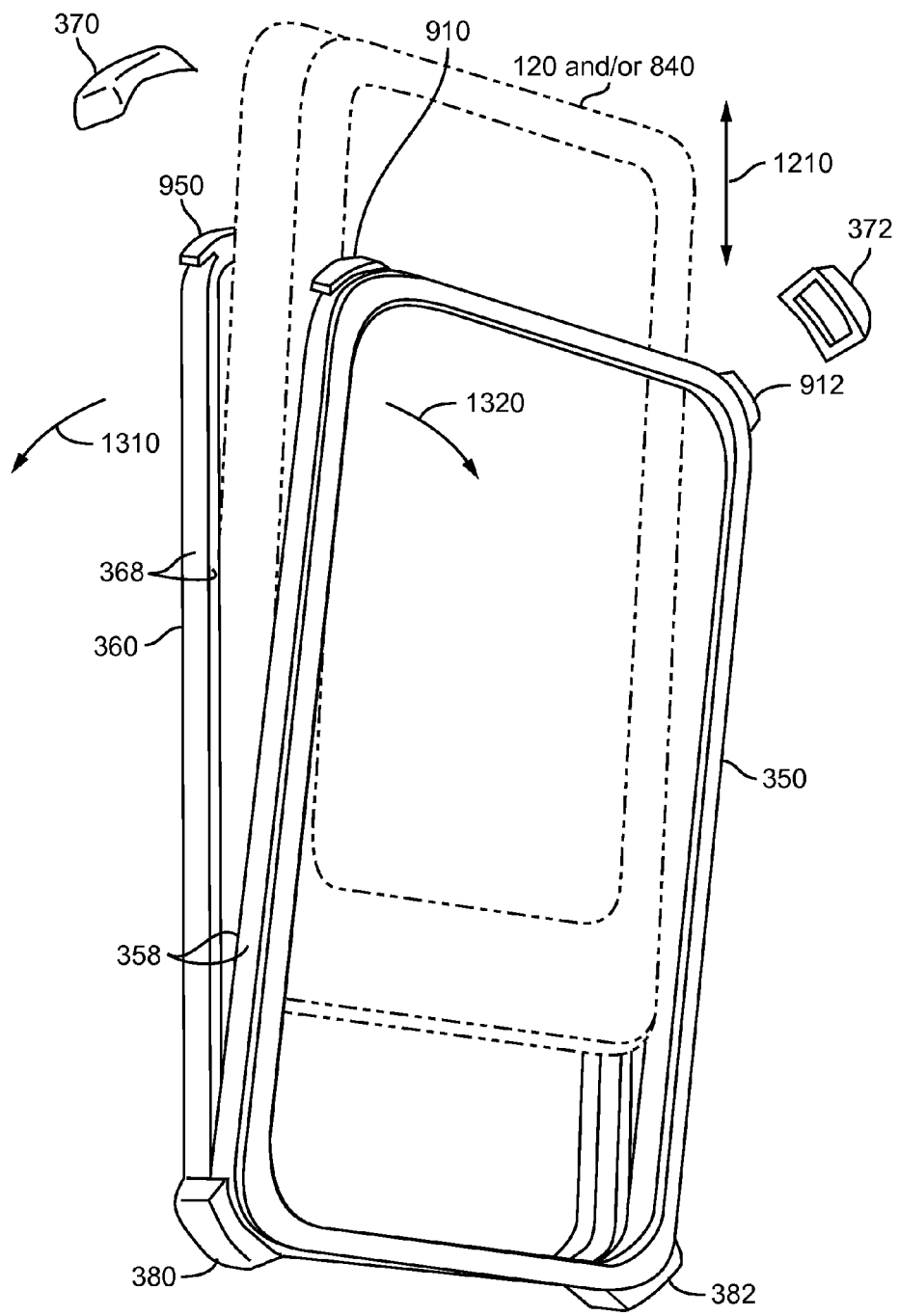
FIG. 13 is a plan view of the implementation of FIG. 3 with bumpers decoupled and the front and back frames separated to remove the mobile device and/or the panel.

In an implementation of panel 140, panel 1440 may perform one or more of the functions discussed above with respect to panel 140. In an implementation, panel 1440 performs the Power function discussed above in Table 1. An implementation of energy receiver 142 and energy storage 144 are shown as 1442 and 1444 respectively in FIG. 14. Energy receiver 1442 includes coil 1410, converter circuit 1420, and charging circuit 1430. Energy storage 1444 includes battery 1450, converter circuit 1460, and charging circuit 1470. Panel 1440 further includes processing circuit 1446.

A coil includes a conductor (e.g., wire) that cooperates with an electromagnetic field to provide a current. An alternating electromagnetic field interacts with the coil to induce a current in the coil. The electromagnetic field may be provided by another coil that is inductively coupled (e.g., inductive, resonate) with coil 1410. In another implementation, coil 1410 may be replaced with a conductor that provides energy via wired connection.

A converter circuit may perform any conventional conversion of electrical energy. A conversion circuit may alter one or more characteristics (e.g., current, voltage, slew rate, power, average power, frequency) of electrical energy and/or an electrical signal. Conversions performed by a conversion circuit may include converting alternating current to direct current, increasing or decreasing a voltage of the current, and providing a current as one or more pulses of current. A converter circuit may be monitored and/or controlled by processing circuit 1446. Processing circuit 1446 may determine one or more of the characteristics of the electrical energy provided by the converter circuit.

A charging circuit receives energy and provides energy for charging a rechargeable battery. A charging circuit may monitor a status (e.g., condition, state of operation, level of charge) of a battery and provide energy to charge the battery responsive to monitoring. A charging circuit may charge a battery then provide a trickle current to hold the charge on the battery. A charging circuit may alter a rate of charging responsive to the charge held by the battery and/or demands for charge from the battery. A charging circuit may be controlled and/or monitored by processing circuit 1446. Processing circuit 1446 may determine the characteristics of the energy provided to a battery, whether battery 1450 and/or a battery of a mobile device. Processing circuit 1446 may determine a status the battery. Processing circuit 1446 may determine an amount of energy and/or an amount of energy per time (e.g., energy density, power) provided by a charging circuit. Processing circuit 1446 may curtail (e.g., reduce) an amount of energy received by a charging circuit.

As discussed above, processing circuit 1446 may control one or more operations of converter circuit 1420, converter circuit 1460, charging circuit 1430, and/or charging circuit 1470. Control may be provided in accordance with a stored program executed by processing circuit 1446. Processing circuit 1446 may further receive information (e.g., data) from the mobile device via any connection (e.g., 162, 164, 168) and may perform a control operation in accordance with data received from the mobile device.

For example, a mobile device may provide information to processing circuit 1446 regarding an amount of energy stored by the battery of the mobile device. A mobile circuit may provide information regarding an expected use so that processing circuit 1440 may provide energy to the mobile device prior to the expected use. Further, a mobile device may execute a user application (e.g., app) whereby the user may provide information to processing circuit 1446 for controlling the operation of converter circuit 1420, converter circuit 1460, charging circuit 1430, and/or charging circuit 1470.

Information from a mobile device and/or an application running on the mobile device that may be provided to processing circuit 1446 of panel 1440 may include a status of a battery of the mobile device, an amount of energy in the battery of the mobile device, a rate of energy usage by the mobile device, an expected time to discharge of the battery of the mobile device, a desired rate for receiving energy, a maximum rate for receiving energy, a maximum amount of energy that may be received, a time for starting and/or stopping provision of energy.

Processing circuit 1440 may provide information (e.g., data) to mobile device regarding the status of energy receiver 1442 and/or energy storage 1444. Processing circuit 1440 may provide information as to whether coil 1410 is receiving energy, a rate of charging battery 1450, a rate of discharging battery 1450, a voltage of operation of charging circuit 1470, a rate of energy provision by charging circuit 1470, an amount of time until battery 1450 is fully charged, and/or an amount of time until battery 1450 is discharged to a threshold. An application of the mobile device may receive the information provided by processing circuit 1440. An application may provide information to processing circuit 1440 in accordance with the information provided by processing circuit 1446 to the application. An application control operation of the mobile device in accordance with information provided by processing circuit 1446. Operations controlled by an application may include terminating a function to reduce energy consumption, increasing or decreasing the brightness of the display of the mobile device to increase or decrease respectively energy usage, and/or provide an notice to a user.

Control functions performed by processing circuit 1446 with respect to converter circuit 1420 and/or 1460 and/or charging circuit 1430 and/or 1470 may be A battery receives, stores, and provides energy. A battery may be rechargeable and thereby capable of performing repetitive cycles of receiving, storing, and providing energy. A battery may provide energy for any use including to charge another battery and to provide energy for the operation of electronic circuits. A battery may provide energy at the same time it receives energy. A battery may store and/or provide energy for a time without receiving additional energy. A physical characteristic (e.g., temperature, physical size) of a battery may change during operation (e.g., charge, store, discharge) of the battery.

Coil 1410 inductively receives energy and provides an alternating current to converter circuit 1420. Coil 1410 may be replaced by a direct connection to an AC or DC line source.

Converter circuit 1420 converts an alternating current provided by coil 1410 or by a line source into a direct current having the characteristics needed by charging circuit 1430 to charge battery 1450. Charging circuit 1430 provides energy to battery 1450 to charge and/or maintain the charge of battery 1450. Charging circuit 1430 may perform all or some of the functions of converter circuit 1420.

Battery 1450 receives energy from charging circuit 1430. Battery 1450 stores the received energy. Battery 1450 provides energy to converter circuit 1460.

Converter circuit 1460 receives energy from battery 1450. Converter circuit 1460 provides energy to charging circuit 1470 having the electrical characteristics need by charging circuit 1470. The operation of converter circuit 1460 may be independent of the operation of converter circuit 1420. Charging circuit 1470 may perform all or some of the functions of converter circuit 1460.

Charging circuit 1470 receives energy from converter circuit 1460. Charging circuit 1470 provides energy to mobile device 120 via connector 160. The energy provided by charging circuit 1470 may be used directly by mobile device 120 and/or may be provided to a battery of mobile device 120 for storage. Charging circuit 1470 may monitor and/or control the charging of a battery of mobile device 120. Charging circuit 1470 may charge the battery of mobile device 120 to an amount of charge and/or maintain the charged state of the battery. The energy provided by battery 1450 to mobile device 120 via converter circuit 1460 and charging circuit 1470 may be used to extend the time of operation of mobile device 120.

A battery may provide energy for the operation of converter circuits, charging circuits, and processing circuits. For example, battery 1450 may provide energy for the operation of at least processing circuit 1446. Battery 1450 may further provide energy for the operation of charging circuit 1430, converter circuit 1460, and charging circuit 1470 if such circuits need energy to operate other than the energy provided by the their respective input signals.

Figure 15:
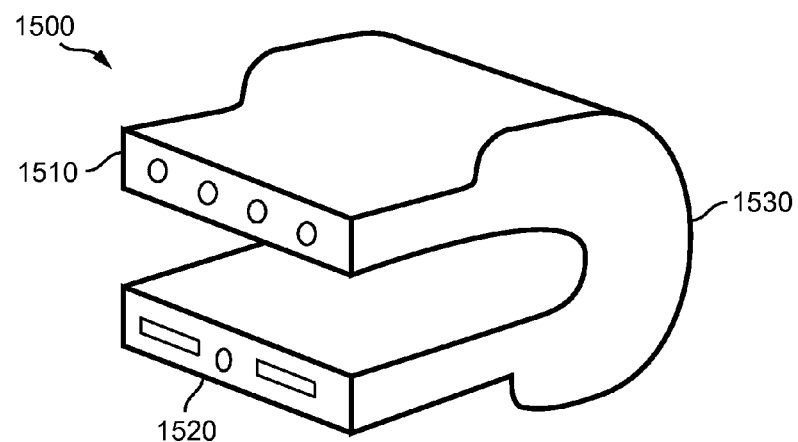
FIG. 15 is a plan view of an implementation of a coupler for implementing connector 160.

Connector 160 may include a wired connection. Coupler 1500 of FIG. 15 performs the function of connector 160. Interface 1510 couples to the output of charging circuit 1470. Interface 1510 may be consistent (e.g., the same) for all panels 840 regardless of the model and/or type of mobile device 120. Interface 1520 couples to the charging connector, possibly a combined charging/data connector, of mobile device 120. Interface 1520 may need to be different for different models and/or types of mobile devices 120.

Coupler 1500 may include portion 1530 for manual grasping (e.g., grabbing) by a user to insert or remove connector 160. A user may manually position coupler 1500 relative to mobile device 120 and panel 840. A user may align interface 1510 and 1520 with the corresponding connectors on mobile device 120 and panel 840. A user may insert (e.g., push) coupler 1500 into the connectors on mobile device 120 and panel 840 to establish a connection via connector 160 between charging circuit 1470 and mobile device 120. Coupler 1500 may include one or more conductors for establishing an electrical connection between mobile device 120 and panel 840.

In another implementation of connector 160, interface 1510 remains coupled to panel 840 and interface 1520 is manually manipulated to coupled interface 1520 to mobile device 120.

Figure 16:
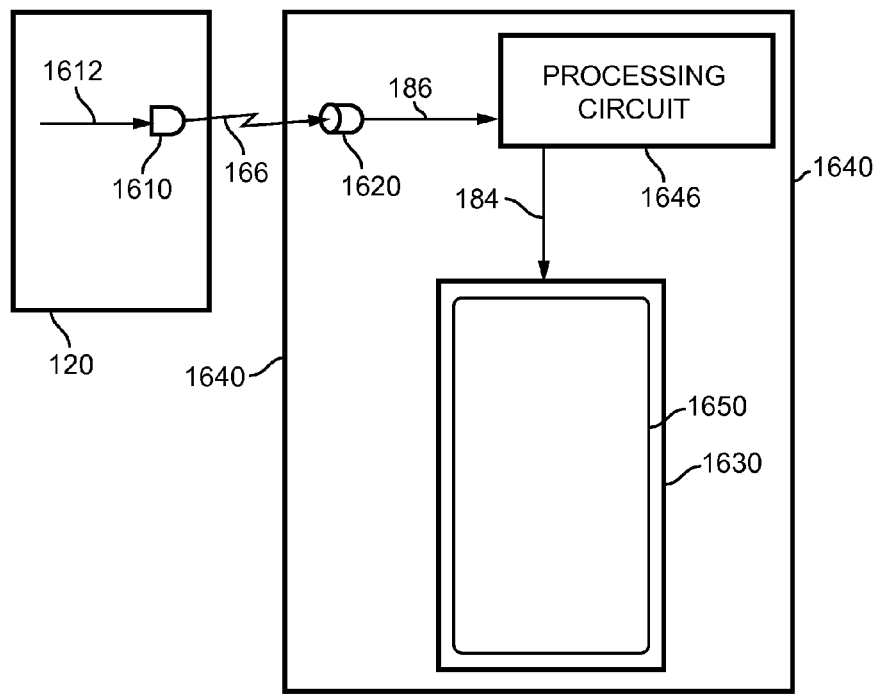
FIG. 16 is a functional block diagram of a panel with an implementation of another function of FIG. 1 according to various aspects of the present invention.

In another implementation of panel 140, panel 1640 performs the User Display function discussed above in Table 1. An implementation of light output 128 and light receiver 150 are shown as LED 1610 and photodetector 1620 respectively in FIG. 16. LED 1610 performs the functions of light output 128 discussed above. Photodetector 1620 performs the functions of light receiver 150 discussed above.

LED 1610 provides light responsive to an electrical signal provided on connector 1612. Mobile device 120 provides the electrical signal. Electrical signal 1612 to LED 1610 may be responsive to an application executed on mobile device 120. The application may be a user application and/or an application provided by the manufacturer and built-in to mobile device 120. A user may provide information to the application to control the operation of the application. A photodetector may include a photodiode, a phototransistor, a photovoltaic cell, active pixel sensors, and/or charged-coupled devices.

Light from LED 1610 traverses (e.g., travels) connector 166, which in this case is a gap of air between LED 1610 and photodetector 1620. Photodetector 1620 detects light provided via connector 166 and provides an electrical signal responsive to the light. Photodetector 1620 provides the electrical signal to processing circuit 1646 via connector 186. Photodetector 1620 may demodulate and/or decode light 166 to provide an electrical signal in accordance with information that is encoded by mobile device 120 in the light.

As discussed above, light 166 may be encoded to include information (e.g., data). The information may include any information, stored, received, and/or transmitted by mobile device 120. Information may include the information presented on the display of mobile device 120 and information (e.g., warnings, alerts, weather, tweets, postings) received by mobile device 120 via any communication channel (e.g., link) available to mobile device 120.

Processing circuit 146 may receive the electrical signal unprocessed from photodetector 1620. Processing circuit 146 may process (e.g., convert, decode, demodulate) the electrical signal to extract any information carried by the electrical signal. Processing circuit 146 may provide the information for presentation on user display 1630. User display 1630 may perform the functions of user display 154 discussed above. User display 1630 may present the information as content 1650 on user display 1630 for viewing by a user. Content 1650 presented on user display 1630 may mirror (e.g., be the same as) the information presented on the display of mobile device 120 or content 1650 include additional or different information in part or whole.

Display 1630 may include a display that uses any conventional technology (e.g., LED, plasma, touch screen, e-ink). User display 1630 may further include mechanical devices (e.g., vibrators) and audio devices (e.g., speakers) for providing haptic and/or audio information to a user.

Figure 17:
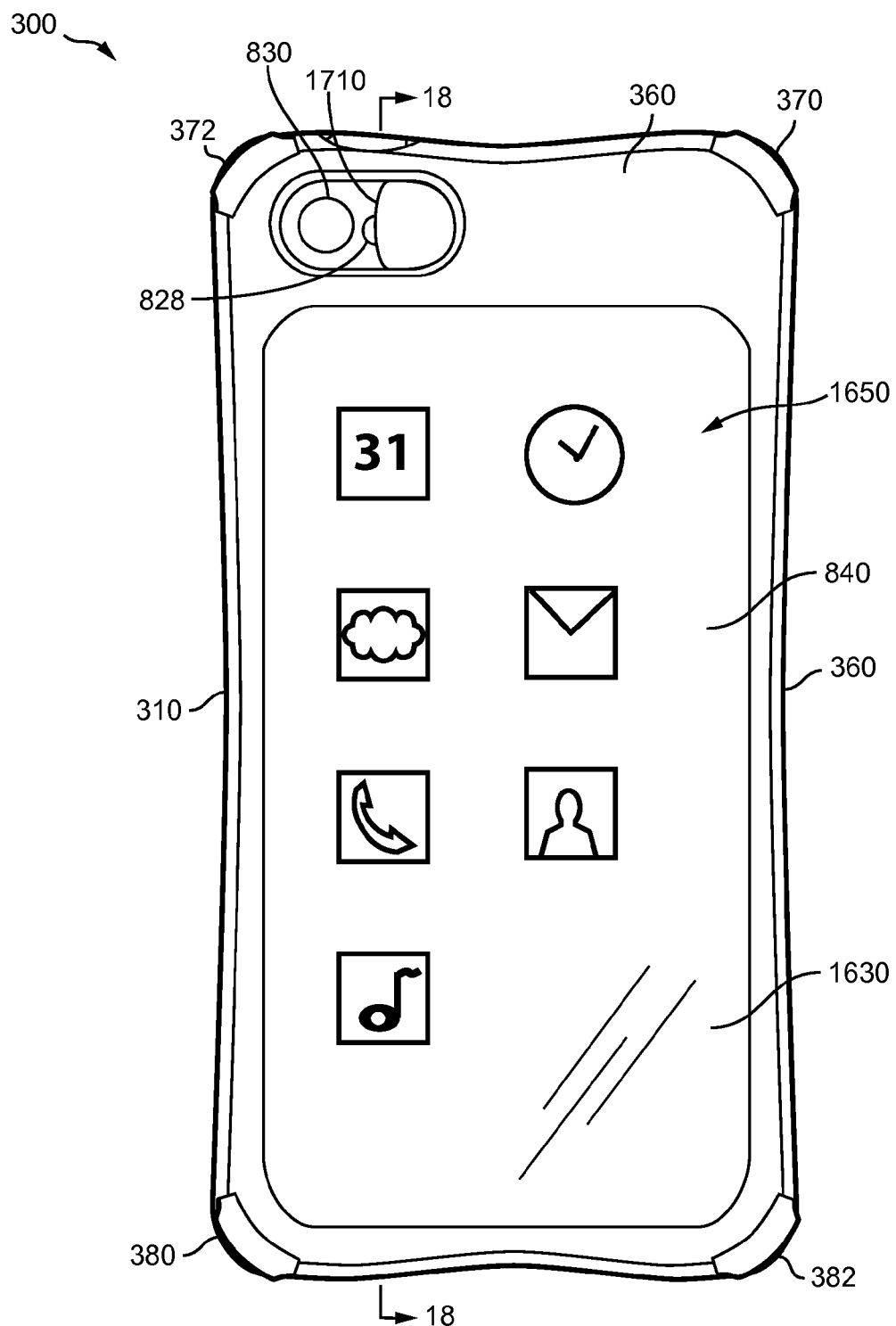
FIG. 17 is a plan view of the rear of an implementation of FIG. 16.
Figure 18:
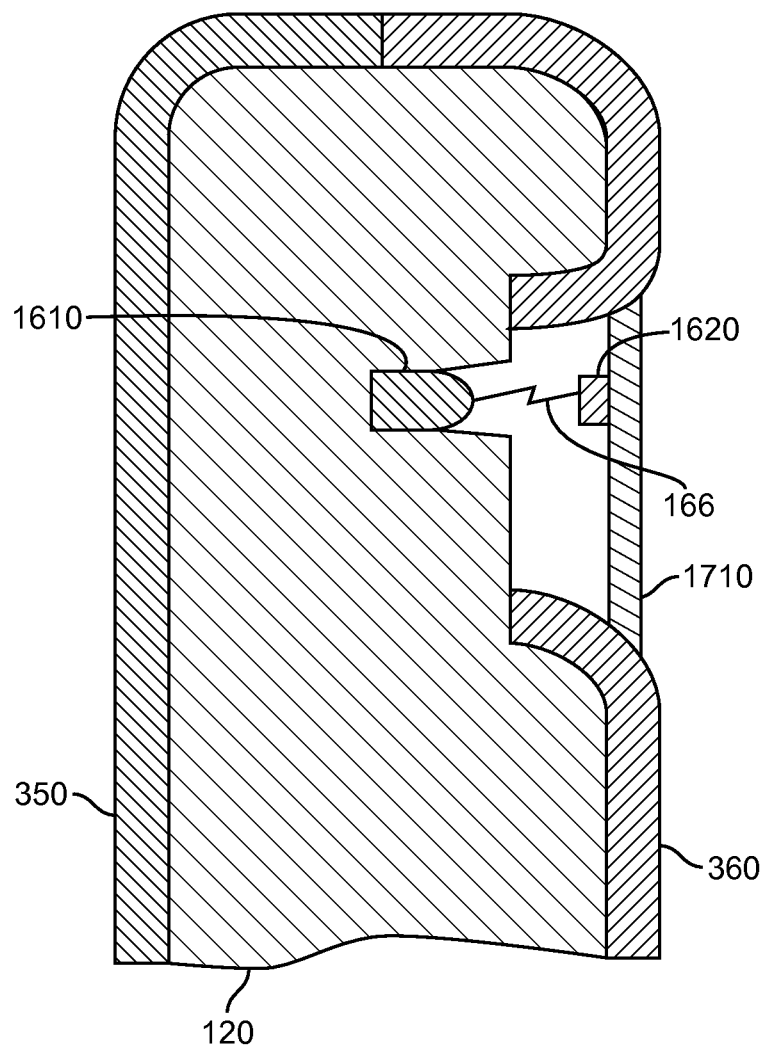
FIG. 18 is a cross-section of the plan view of the implementation of FIG. 17.

In an implementation of a system that includes panel 1640, case 310 includes shutter 1710 as shown in FIGS. 17-18. Photodetector 1620 is coupled to shutter 1710. Shutter 1710 may be moved (e.g., left with respect to FIG. 17) to position photodetector 1620 across from (e.g., adjacent to) LED 1610. While positioned across from LED 1610, photodetector 1620 may detect light 166 from LED 1610 and provide an electrical signal to processing circuit 146 via connector 186. Shutter 1710 may be moved to completely or partially cover LED 1610. Covering LED 1610 only partially permits LED to provide information to photodetector 1620 while still performing another function (e.g., camera flash).

Panel 1640 may further include energy receiver 1442 and battery 1450 so that battery 1450 may be charged to provide power for photodetector 1620, processing circuit 146, and user display 1630. Although panel 1640 may include energy receiver 1442 and battery 1450, panel 1640 performs only User Display function discussed in Table 1 and not the combination of the Power and User Display functions. In another implementation, the components of panel 1440 may be combined with the components of panel 1640 to provide a panel that performs the Power and User Display functions discussed in Table 1.

In the event that a panel provides all of the functions desired by a user, a user may keep the panel in case 310 indefinitely to have access to the functions. In the event that a panel does not provide a function desired by a user, or a user requires a particular function only occasionally, the user may open case 310 to remove the present panel and to insert a different panel that performs the desired functions. Panels may be inserted and removed as needed to access and use the functions performed by each individual panel.

The foregoing description discusses preferred embodiments of the present invention, which may be changed or modified without departing from the scope of the present invention as defined in the claims. Examples listed in parentheses may be used in the alternative or in any practical combination. As used in the specification and claims, the words 'comprising', 'including', and 'having' introduce an open ended statement of component structures and/or functions. In the specification and claims, the words 'a' and 'an' are used as indefinite articles meaning 'one or more'. While for the sake of clarity of description, several specific embodiments of the invention have been described, the scope of the invention is intended to be measured by the claims as set forth below.

What is claimed is:

1. A system for cooperating with a provided mobile device to provide a presentation in cooperation with the mobile device, the mobile phone comprises a light source, the system comprising:
   a case having an open position and a closed position; and
   a panel that cooperates with the mobile device to provide the presentation, the panel comprising a display, a light detector, and a processing circuit; wherein:
      the case includes a front frame, a rear frame, and at least three bumpers;
      the front frame includes a front lip, at least three protrusions, and a front aperture;
      the rear frame includes a rear lip, at least three protrusions, and a rear aperture;
      in the closed position, the front frame is proximate to the rear frame such that the front lip contacts the rear lip, each protrusion of the front frame is adjacent to a respective protrusion of the rear frame, and a respective bumper contacts respective adjacent protrusions of the front frame and the rear frame to hold the front frame proximate to the rear frame and the front lip in contact with the rear lip;
      in the closed position, the case encloses the mobile device and the panel such that a display of the mobile device is visible through the front aperture and the display of the panel is visible through the rear aperture;
      in the closed position, the mobile device and the panel cannot be removed from the case;
      in the open position, two or more bumpers are removed from the protrusions of the front frame and the rear frame so that front frame may be separated from rear frame so that most of front lip does not contact most of rear lip;
      in the open position, the mobile device, the panel, or both may be moved between the separated portions of the front frame and the rear frame to insert or remove the mobile device, the panel, or both to or from the case;
      the light source of the mobile device provides information via light to the light detector; and
      responsive to the light, the processing circuit provides the information for presentation on the display of the panel.

2. The system of claim 1 wherein:
the case further has a plurality of sides; and
all bumpers are removed from the protrusions of the front frame and the rear frame except for one or more adjacent bumpers on a single side of the case, the one or more adjacent bumpers remain coupled to protrusions of the front frame and the rear frame and operate as a hinge for front frame and rear frame to pivot away from each other so that front lip does not contact rear lip except along the single side.

3. The system of claim 1 wherein the information presented on the display of the panel is the same as the information presented on the display of the mobile device.

4. The system of claim 1 wherein the information presented on the display of the panel comprises at least one of an alert, a message, an email, a tweet, a warning received by the mobile device.

5. The system of claim 1 wherein the display of the panel comprises an electrophoretic ink (e-ink) display.

6. A system for cooperating with a provided mobile device to provide a presentation, the mobile device includes a light source, the system comprising:
a case;
a light detector;
a panel that cooperates with the mobile device to provide the presentation, the panel comprising a display; wherein:
the case has an open position and a closed position;
the case comprises a front frame and a rear frame;
the front frame includes a front aperture;
the rear frame includes a rear aperture;
in the closed position, the case encloses the mobile device and the panel such that a display of the mobile device is visible through the front aperture and the display of the panel is visible through the rear aperture;
in the closed position, the mobile device and the panel cannot be removed from the case;
in the closed position, the case positions the light detector proximate to the light source of the mobile device;
the light source of the mobile device provides information via light to the light detector; and
responsive to the light, the panel provides the information for presentation on the display of the panel.

7. The system of claim 6 wherein the information presented on the display of the panel is the same as the information presented on the display of the mobile device.

8. The system of claim 6 wherein the information presented on the display of the panel comprises at least one of an alert, a message, an email, a tweet, a warning received by the mobile device.

9. The system of claim 6 wherein the display of the panel comprises an electrophoretic ink (e-ink) display.

10. The system of claim 6 wherein the light source comprises an LED.

11. The system of claim 6 wherein the light detector comprises a photodetector.

12. The system of claim 6 wherein:
the rear frame further comprises a shutter;
the light detector is coupled to the shutter; and
moving the shutter to a partially closed positions the light detector proximate to the light source.

13. The system of claim 6 wherein the information is encoded in the light provided by the light source.

14. A panel for cooperating with a provided case and a provided mobile device to provide a presentation, the mobile device includes a light source, the case includes a front frame having an aperture and a rear frame having an aperture, the front frame and the rear frame having an open position and a closed position, the panel comprising:
a light detector;
a display; and
a processing circuit; wherein:
in the closed position, the case encloses the mobile device and the panel such that a display of the mobile device is visible through the front aperture and the display of the panel is visible through the rear aperture;
in the closed position, the mobile device and the panel cannot be removed from the case;
in the closed position, the case positions the light detector proximate to the light source of the mobile device;
the light source of the mobile device provides information via light to the light detector; and
responsive to the light, the processing circuit provides the information for presentation on the display of the panel.

15. The system of claim 14 wherein the information presented on the display of the panel is the same as the information presented on the display of the mobile device.

16. The system of claim 14 wherein the information presented on the display of the panel comprises at least one of an alert, a message, an email, a tweet, a warning received by the mobile device.

17. The system of claim 14 wherein the light source comprises an LED.

18. The system of claim 14 wherein the light detector comprises a photodetector.

19. The system of claim 14 wherein the light source performs the further function of providing light for a camera of the mobile device.

20. The system of claim 14 wherein the information is encoded in the light provided by the light source.

* * * * *